United States Patent [19]

Tien et al.

[11] Patent Number: 5,341,333
[45] Date of Patent: Aug. 23, 1994

[54] CIRCUITS AND METHODS FOR AMPLIFICATION OF ELECTRICAL SIGNALS

[75] Inventors: Ta-Ke Tien; Chau-Chin Wu, both of Cupertino, Calif.

[73] Assignee: Integrated Device Technology, Inc., Santa Clara, Calif.

[21] Appl. No.: 929,874

[22] Filed: Aug. 11, 1992

[51] Int. Cl.$^5$ .............................................. G11C 7/06
[52] U.S. Cl. .............................. 365/189.06; 307/530; 307/568; 330/253; 330/260; 330/277; 330/293; 365/208
[58] Field of Search ................ 307/530, 565, 568; 365/189.06, 204, 207, 208; 330/253, 260, 277, 293

[56] References Cited

U.S. PATENT DOCUMENTS

| | | | |
|---|---|---|---|
| 4,479,094 | 10/1984 | Harris | 330/261 |
| 4,766,333 | 8/1988 | Mobley | 307/530 |
| 4,845,672 | 7/1989 | Watanabe et al. | 365/208 X |
| 4,853,899 | 8/1989 | Kitsukawa et al. | 307/530 X |
| 5,172,340 | 12/1992 | Leforestier et al. | 307/530 X |

FOREIGN PATENT DOCUMENTS 488327  6/1992  European Pat. Off. ............ 365/208

OTHER PUBLICATIONS

Plass, "Data Bus Sense Amp with Switched Isolators" IBM Technical Disclosure Bulletin, vol. 27, No. 2, Jul. 1984 pp. 1328, 1329.
Pages 72–74 from a book entitled *Analog MOS Integrated Circuits For Signal Processing*, R. Gregorian and G. Temes, 1986 (John Wiley & Sons, Inc.).

*Primary Examiner*—James B. Mullins
*Attorney, Agent, or Firm*—Skjerven, Morrill, MacPherson, Franklin & Friel

[57] ABSTRACT

An amplifier used in some embodiments as a sense amplifier for a memory includes a plurality of first sense amplifiers 220.$i$ whose outputs are connected to high capacitance nodes SA, $\overline{SA}$ which in turn are connected to inputs of second sense amplifier 240. The state of nodes SA, $\overline{SA}$ is defined by the currents on the two nodes. The voltages on nodes SA, $\overline{SA}$, however, are kept substantially constant, which increases the state switching speed and reduces the power consumption. When the amplifier is not in use and the power-down circuitry reconfigures the amplifier to reduce the power consumption, the second amplifier 240 places its output OUT2 into a valid state in order to prevent oscillations of the output and to reduce power consumption. When the amplifier returns from the power-down mode, the output OUT2 is kept in that state until nodes SA, $\overline{SA}$ and certain other nodes within the first and second amplifiers settle to proper current and voltage values. As a result, during settling the oscillations on output OUT are prevented and power consumption is reduced.

21 Claims, 11 Drawing Sheets

CIRCUITS AND METHODS FOR AMPLIFICATION OF ELECTRICAL SIGNALS

BACKGROUND OF THE INVENTION

1. Field of the Invention

The invention relates to amplifiers, and more particularly to amplifiers for amplifying voltages of electrical signals.

2. Description of Related Art

Amplifiers are widely used in electrical circuits such as, for example, memory circuits. FIG. 1 illustrates a memory circuit including a sense amplifier 110 which amplifies memory signals. The memory includes an N-column array of memory cells 120.$i,j$. Only one row of the array is shown for simplicity. Each memory cell 120.$i,j$ has two states. One state is interpreted as a logic 1, and the other state is interpreted as a logic 0.

Each memory cell of each column j=1, ..., N is connected to two complementary bit lines BL.j, $\overline{BL}$.j. To read a memory cell 120.i0,j0 in a row i0 and a column j0, a row decoder (not shown) enables all the memory cells 120.i0,j of row i0 to provide their states on the respective bit lines BL.j, $\overline{BL}$.j. In one of its two states, the memory cell 120.i0,j provides a high voltage on bit line BL.j and a low voltage on bit line $\overline{BL}$.j. In the other state, the memory cell provides a low voltage on bit line BL.j and a high voltage on bit line $\overline{BL}$.j.

Y-pass gate 130 receives the column address j0 on column address lines 132 and selects the column j0 by putting out a high voltage signal on the line 140.j0 while keeping the other lines 140.j low. Consequently, NMOS pass transistors 150.j0,1, 150.j0,2 turn on, and all the other pass transistors 150.j,1, 150.j,2 turn off. Hence, bit lines BL.j0 $\overline{BL}$.j0 become connected to respective lines 160, 162 which are connected to respective inputs D, $\overline{D}$ of sense amplifier 110. Sense amplifier 110 produces on its output OUT a voltage indicative of whether the voltage on input D is higher or lower than the voltage on input $\overline{D}$.

The reading speed and the power efficiency of the memory of FIG. 1 suffer from the high capacitance of lines 160, 162. Line 160 has a high capacitance because line 160 is connected to the sources of all the N pass transistors 150.$i$,1, i=1, ..., N. Line 162 has a high capacitance for a similar reason. Because of the high capacitance, charging the lines 160, 162 to proper voltages takes a long time and requires much power.

An improved memory with reduced capacitance is illustrated in FIGS. 2A, 2B and 2C. Here the N memory array columns are grouped in groups of eight columns. Y-pass gate 210 selects one column from each group in response to the column address signals on lines 212. Y-pass gate 210 has eight output lines 140.1 through 140.8. Line 140.1 is connected to the gates of the pass transistors of the first column of each group, that is, to the gates of pass transistors 150.1,1, 150.1,2, 150.9,1, 150.9,2, and so on. Line 140.2 is connected to the gates of the pass transistors of the second columns of each group, and so on. Each group k has line 160.$k$ connected to the sources of the pass transistors 150.$i$,1 of the group, and each group k has line 162.$k$ connected to the sources of the pass transistors 150.$i$,2 of the group. Each group k has its own first sense amplifier 220.$k$ whose inputs D1, $\overline{D1}$ are connected, respectively, to lines 160.$k$, 162.$k$. Each first sense amplifier 220.$k$ has also a select input S. Y-pass gate 230 receives a column address on lines 234 and produces the signals for the select inputs S so as to select only one first sense amplifier 220.$k$. The selected first sense amplifier 220.$k$ amplifies the voltage difference on its inputs D1, $\overline{D1}$ and produces the corresponding amplified voltages on its output OUT1, $\overline{OUT1}$. All the outputs $\overline{OUT1}$ are connected to node SA which is connected to input $\overline{D2}$ of a second sense amplifier 240. All the outputs OUT1 are connected to node $\overline{SA}$ which is connected to input D2 of second sense amplifier 240. Second sense amplifier 240 amplifies the voltage difference on the nodes SA, $\overline{SA}$ and produces an output voltage on its output OUT2 connected to the memory output OUT.

The memory of FIGS. 2A, 2B and 2C is faster because the capacitance of lines 160.$k$, 162.$k$ connected to the selected first sense amplifier 220.$k$ plus the capacitance of nodes SA, $\overline{SA}$ is lower than the capacitance of lines 160, 162 of FIG. 1. Indeed, each of lines 160.$k$, 162.$k$ is connected to only eight bit lines (through pass transistors), and each of nodes SA, $\overline{SA}$ is connected to only N/8 respective outputs OUT1 or $\overline{OUT1}$, while each of lines 160, 162 of the memory of FIG. 1 is connected to N bit lines.

However, the capacitance of nodes SA, $\overline{SA}$ is fairly high, and this capacitance limits the memory speed and increases the memory power consumption.

In order to increase the memory speed, nodes SA, $\overline{SA}$ are resistively shorted to each other by an equalizing transistor 250 whose gate is connected to a reference voltage (not shown). Transistor 250 reduces the voltage difference on nodes SA, $\overline{SA}$ and hence reduces the time and the power required for the voltage difference to switch states.

There is a need, however, for even faster and more power efficient amplifiers for memories and for other circuits.

Another challenge in an amplifier design is adjusting the amplifier for different power supply voltages, for example, adjusting the amplifier when the power supply voltage VCC is changed from 5.0V such as used in larger computers to 3.0V such as used in laptop, notebook, and sub-notebook computers. This challenge is illustrated by FIG. 3 which is a circuit diagram of a prior art amplifier circuit 304 used in each first sense amplifiers 220.$k$ and in second sense amplifier 240. Inputs D, $\overline{D}$ of FIG. 3 correspond to inputs D1, $\overline{D1}$ of each first sense amplifier 220.$k$ and to inputs D2, $\overline{D2}$ of second sense amplifier 240. Output OUT correspond to output OUT1 of each first sense amplifier 220.$k$ and to output OUT2 of second sense amplifier 240. A similar circuit (not shown) provides output $\overline{OUT1}$ of each first sense amplifiers 220.$k$. When circuit 304 is used for second sense amplifier 240, output OUT of circuit 304 is used for output OUT2 of sense amplifier 240, and output $\overline{OUT1}$ of circuit 304 is unused.

Matched PMOS transistors 310, 314 of circuit 304 form a current mirror and source equal currents to the drains of respective transistors 320, 324. Matched NMOS transistors 320, 324 whose gates are connected to, respectively, inputs D, $\overline{D}$, sink current through NMOS transistor 330 whose gate is connected to input S and whose source is connected to ground. Transistors 320, 324 must stay in saturation in order to provide fast voltage switching on output OUT in response to voltage changes on inputs D, $\overline{D}$. The saturation condition requires that the VDS voltages (drain-to-source voltages) of these transistors stay above a certain minimum value VDSSAT. However, when VCC decreases to 3.0

V, VDS of each transistor 320, 324 decreases and may fall below VDSSAT. Further, the current through transistor 330 decreases making the amplifier circuit 304 slower. Hence, circuit 304 needs to be changed for fast operation at a lower VCC value such as 3.0 V. It is desirable to provide an amplifier which is simple to adjust to a lower VCC value.

SUMMARY OF THE INVENTION

The invention provides amplifiers, including amplifiers suitable for memories, that are, in some embodiments, fast and power efficient because they do not rely on voltage differentiation between large capacitance nodes but, instead, they rely on current differentiation between high capacitance nodes. More particularly, in some embodiments the voltages on high capacitance nodes such as nodes SA, $\overline{SA}$ of FIG. 2 are kept substantially constant, and the state of the two nodes is indicated by the difference between the currents on the two nodes rather than between the voltages. Since the voltages are substantially constant, the state switching is fast and power efficient despite the high capacitance of the two nodes.

The invention provides also a power-down mode to reduce the power consumption of the amplifier when the memory is not being read, and the invention provides a fast and power efficient return from the power-down mode. In the power-down mode, the amplifier output OUT is kept in a valid state, for example, in the high voltage state, so as to reduce the power consumption in the external circuitry connected to the output OUT. When a memory reading operation begins and the amplifier leaves the power-down mode, the state of output OUT is kept unchanged until the high capacitance nodes and some other nodes of the amplifier settle to the proper voltage and current values. Hence, the output OUT is prevented from oscillating or reaching an invalid state until the nodes settle. Preventing oscillations and invalid states on output OUT saves power.

In power-down mode, the high capacitance nodes are precharged so that when the memory returns from the power-down mode, the high capacitance nodes quickly reach their proper voltage values. Hence, return from the power-down mode is fast.

In some embodiments, the amplifier includes a current-mirror amplifier circuit which includes two PMOS transistors such as transistors 310, 314 of FIG. 3, and two NMOS transistors such as transistors 320, 324 of FIG. 3. However, unlike in FIG. 3, the amplifier of the invention includes in place of transistor 330 two NMOS transistors connected in series. One of these two transistors has its gate connected to a reference voltage, and the current and the VDS of this one transistor can be adjusted simply by adjusting the reference voltage. Consequently, the VDS of the NMOS transistors such as transistors 320, 324 of FIG. 3 can also be adjusted simply by adjusting the reference voltage, which simplifies adjusting the amplifier for different VCC values including VCC=3.0 V.

Other features of the invention are described below. The invention is described by the appended claims.

DESCRIPTION OF THE PREFERRED EMBODIMENTS

Figure 4:
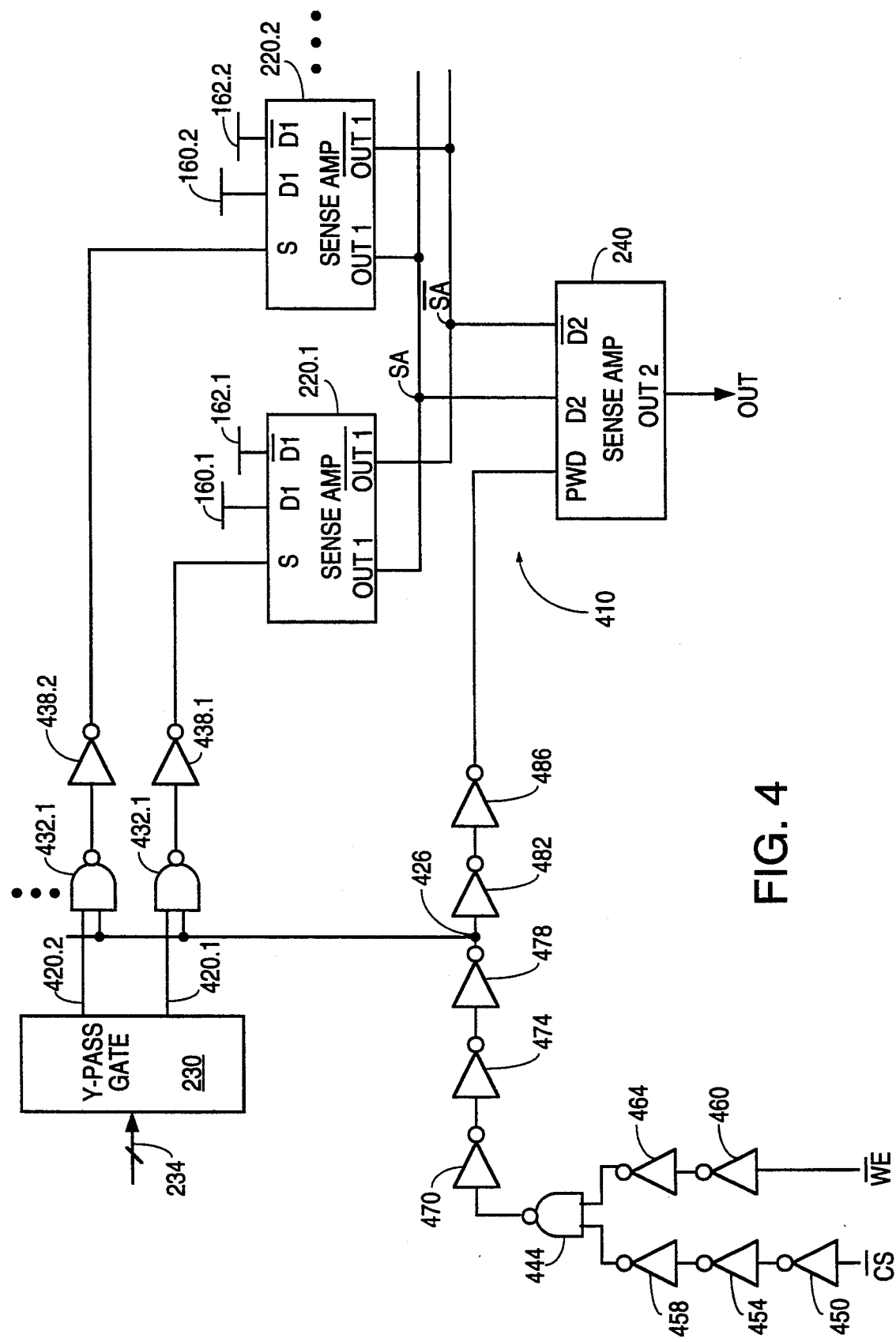
FIG. 4 is a diagram of a memory portion and of an amplifier according to the present invention.

FIG. 4 illustrates a portion of a memory having a fast, power efficient sense amplifier 410 which includes first sense amplifiers 220.k and second sense amplifier 240. Memory cells 120.i,j, bit lines BL.j, $\overline{BL}$.j, pass transistors 150.i,1, 150.i,2, and Y-pass gate 210 are like those in FIG. 2 and are not illustrated in FIG. 4. Y-pass gate 230 decodes the signals on the column address lines 234 and produces a high voltage signal on one of the lines 420.i. The signal on each line 420.i is ANDed with the signal on a node 426 by the NAND gate 432.i and inverter 438.i. The signal on node 426 has a high voltage during read operations and a low voltage otherwise. The output of inverter 438.i is connected to the select input S of the respective first sense amplifier 220.i.

Figure 1:
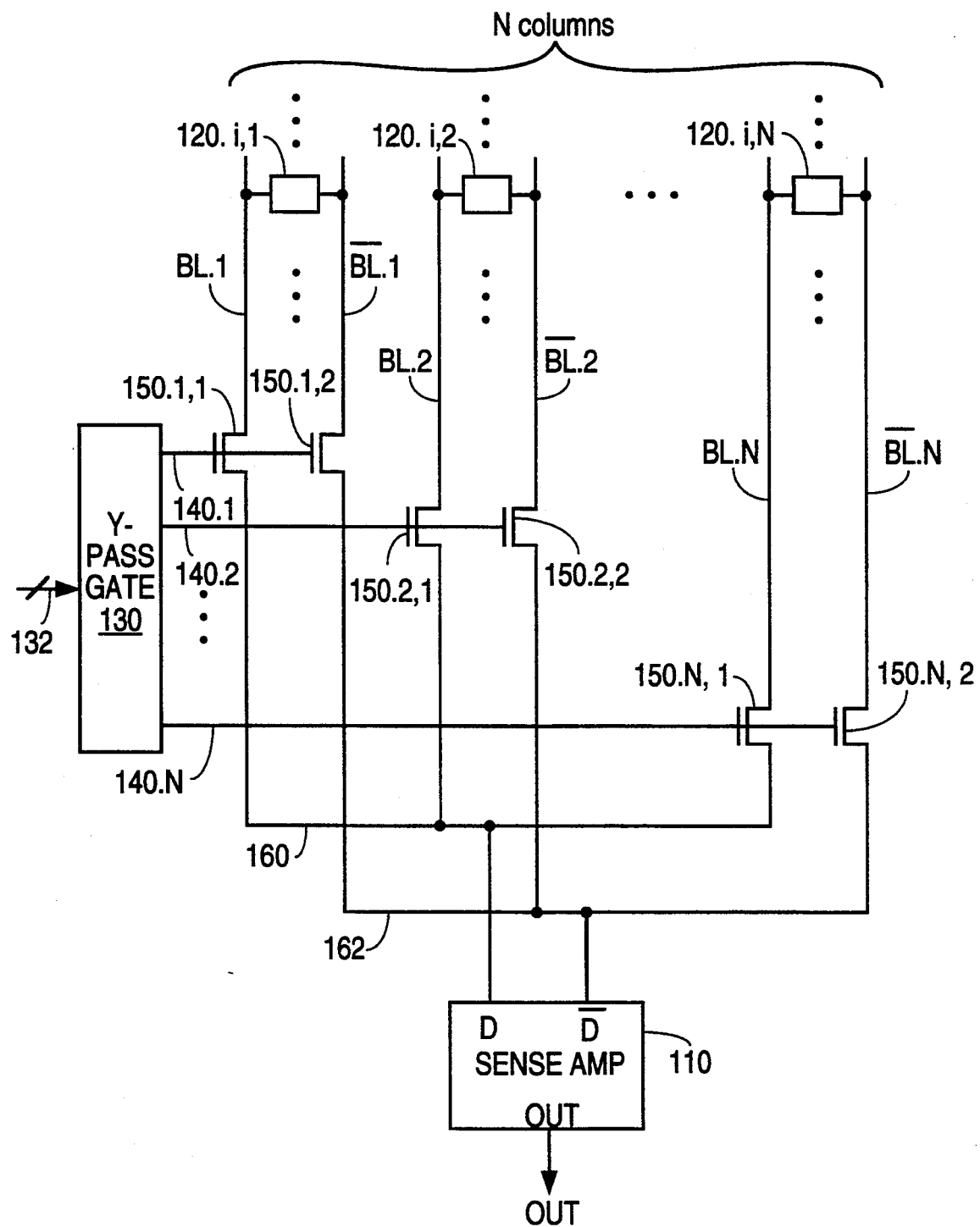
FIGS. 1, 2A, 2B and 2C are diagrams of prior art memories and amplifiers.
Figure 2A:
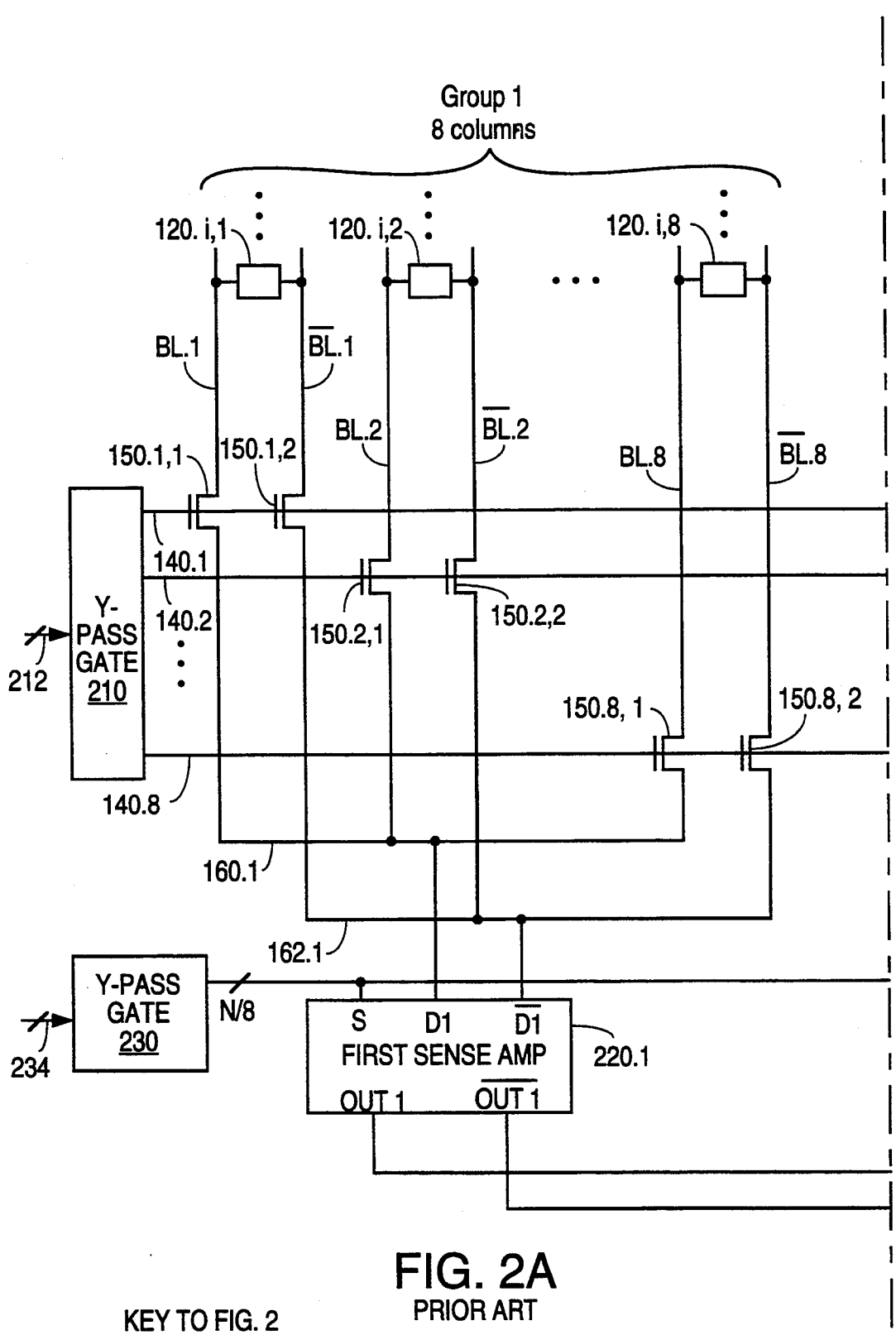
Figure 2B:
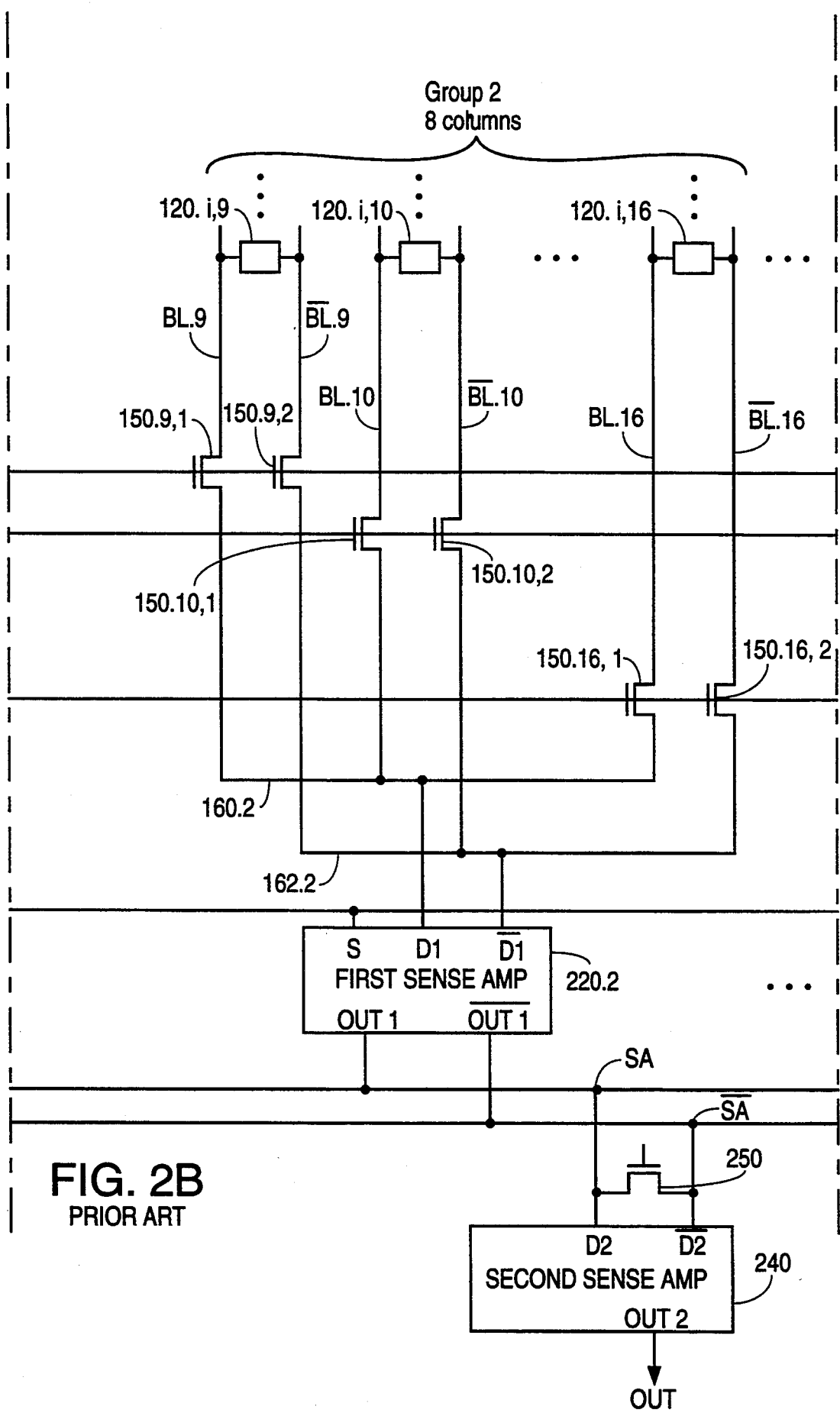
Figure 2C:
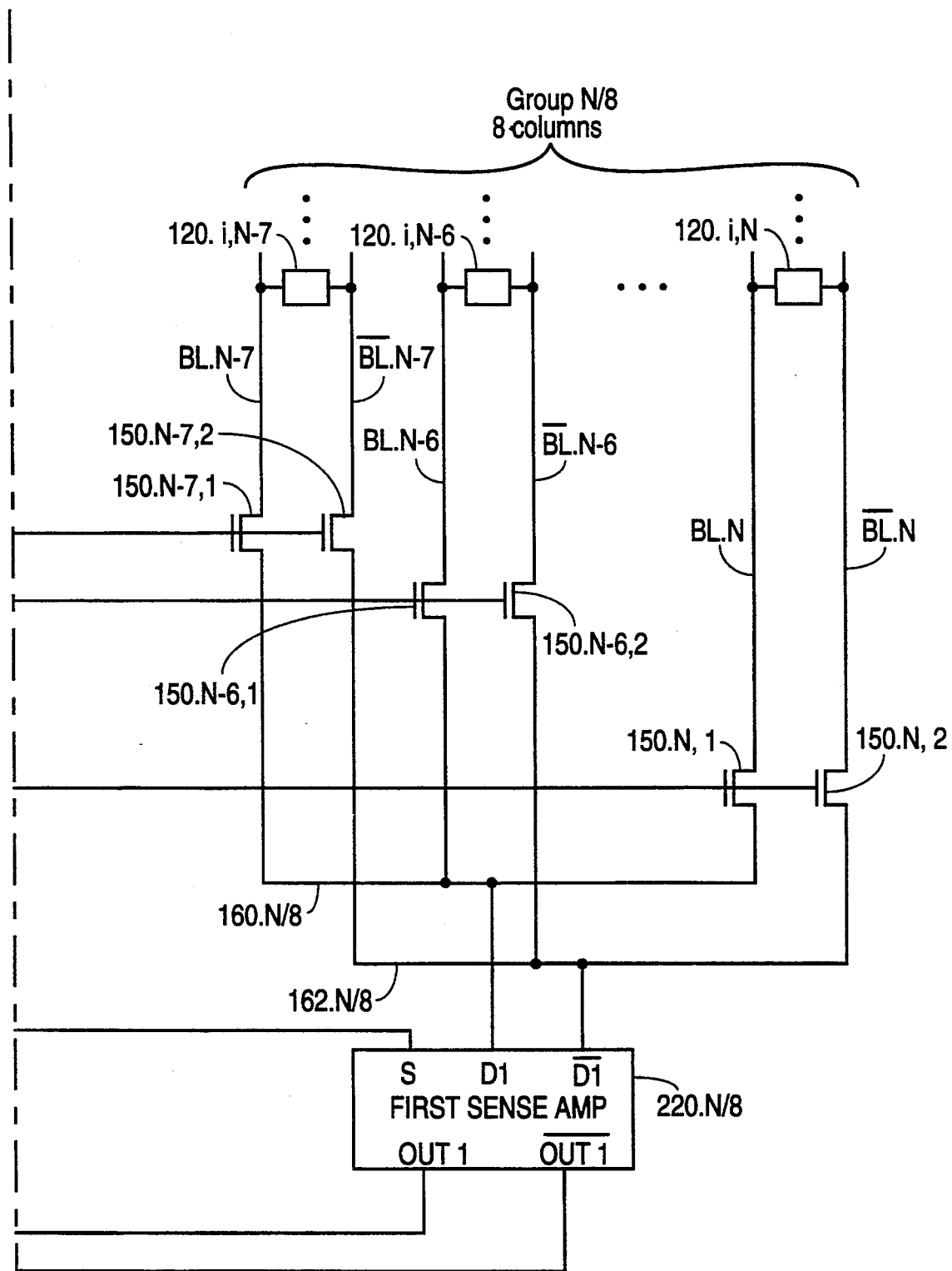
Figure 3:
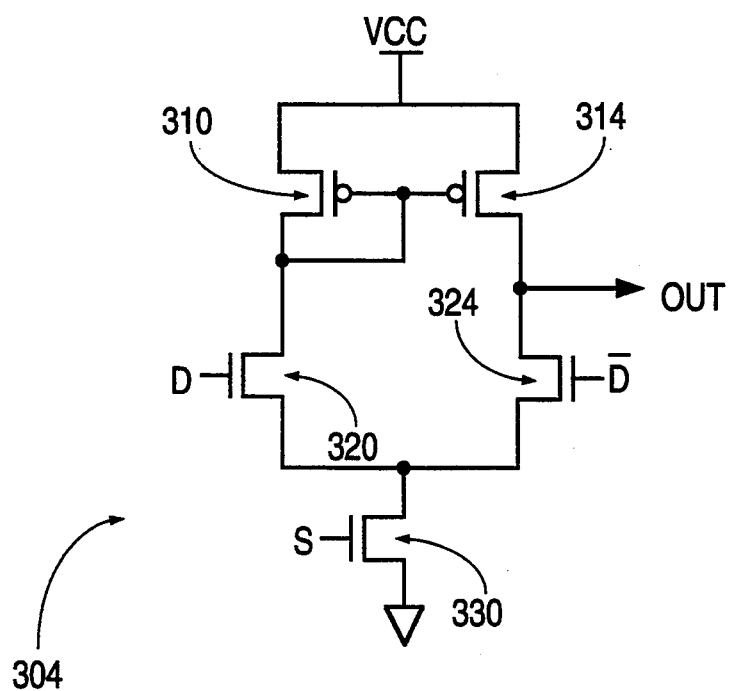
FIG. 3 is a diagram of a prior art amplifier circuit used in amplifiers of FIG. 2.

Inputs D1, $\overline{D1}$ of each first sense amplifier 220.i are connected to respective lines 160.i, 162.i as in FIG. 2. During a read operation, first sense amplifier 220.i selected by the high signal on its input S converts the difference between the voltages on inputs D1, $\overline{D1}$ of the first sense amplifier into currents on outputs OUT1, $\overline{OUT1}$ of the first sense amplifier. Outputs OUT1 are connected, respectively, to the high capacitance nodes SA, $\overline{SA}$. The voltages on nodes SA, $\overline{SA}$ are kept substantially constant. Hence state switching is fast and power efficient despite the high capacitance of nodes SA, $\overline{SA}$. Further, no equalizing transistor between nodes SA, $\overline{SA}$ is needed.

Nodes SA, $\overline{SA}$ are connected, respectively, to inputs D2, $\overline{D2}$ of second sense amplifier 240. Second sense amplifier 240 converts the current difference on nodes SA, $\overline{SA}$ into a voltage on the output OUT2 connected to the memory output OUT.

Sense amplifier 410 is fast and power efficient because during amplification the voltages change only on the nodes, such as node OUT2, whose combined capacitance is lower than the capacitance of node SA or node $\overline{SA}$.

The voltage signal on node 426 equals CS AND $\overline{WE}$. CS is an inverse of $\overline{CS}$, and $\overline{CS}$ is a chip enable signal which is low when the memory is enabled. $\overline{WE}$ is a write enable signal which is low when the memory is being written. Signal $\overline{CS}$ is connected to an input of NAND gate 444 through inverters 450, 454, 458. Signal $\overline{WE}$ is connected to the other input of NAND gate 444 through inverters 460, 464. The output of NAND gate 444 is connected to node 426 through inverters 470, 474, 478.

When the memory is not being read, the low signal on node 426 causes all the first sense amplifiers 220.i to be deselected by the low signals on their respective inputs S. Hence power consumption of the first sense amplifiers 220.i becomes reduced. Node 426 is connected through inverters 482, 486 to input PWD ("power down") of second sense amplifier 240. When the memory is not being read, the low signal on input PWD disables second sense amplifier 240 to reduce power consumption. In this disabled or "power-down" mode, second sense amplifier 240 drives its output OUT2 to a valid state, a high voltage state in some embodiments. In particular, second sense amplifier 240 prevents the voltage on output OUT2 from oscillating and reaching an invalid state. An invalid state could increase power consumption if, for example, the external circuitry (not shown) connected to the output OUT2 is a CMOS circuitry. In a CMOS circuitry, an invalid state could force both the PMOS and the NMOS transistors of the CMOS inverters to conduct causing excessive power consumption and oscillation. Keeping the output OUT2 in a valid state reduces power consumption and oscillation in the external circuitry.

When the voltage on node 426 becomes high to indicate a reading operation, the delay of inverters 482, 486 causes the second sense amplifier 240 to remain in the power-down mode until the selected first sense amplifier 220.i develops currents on nodes SA, $\overline{SA}$. Further, even after the input PWD of second sense amplifier 240 becomes high, second sense amplifier 240 keeps its output OUT2 high while the nodes SA, $\overline{SA}$ and some nodes within second sense amplifier 240 settle to their proper voltage and current values. Hence output OUT2 of sense amplifier 240 is kept from oscillating or reaching invalid states until these nodes settle.

Figure 5:
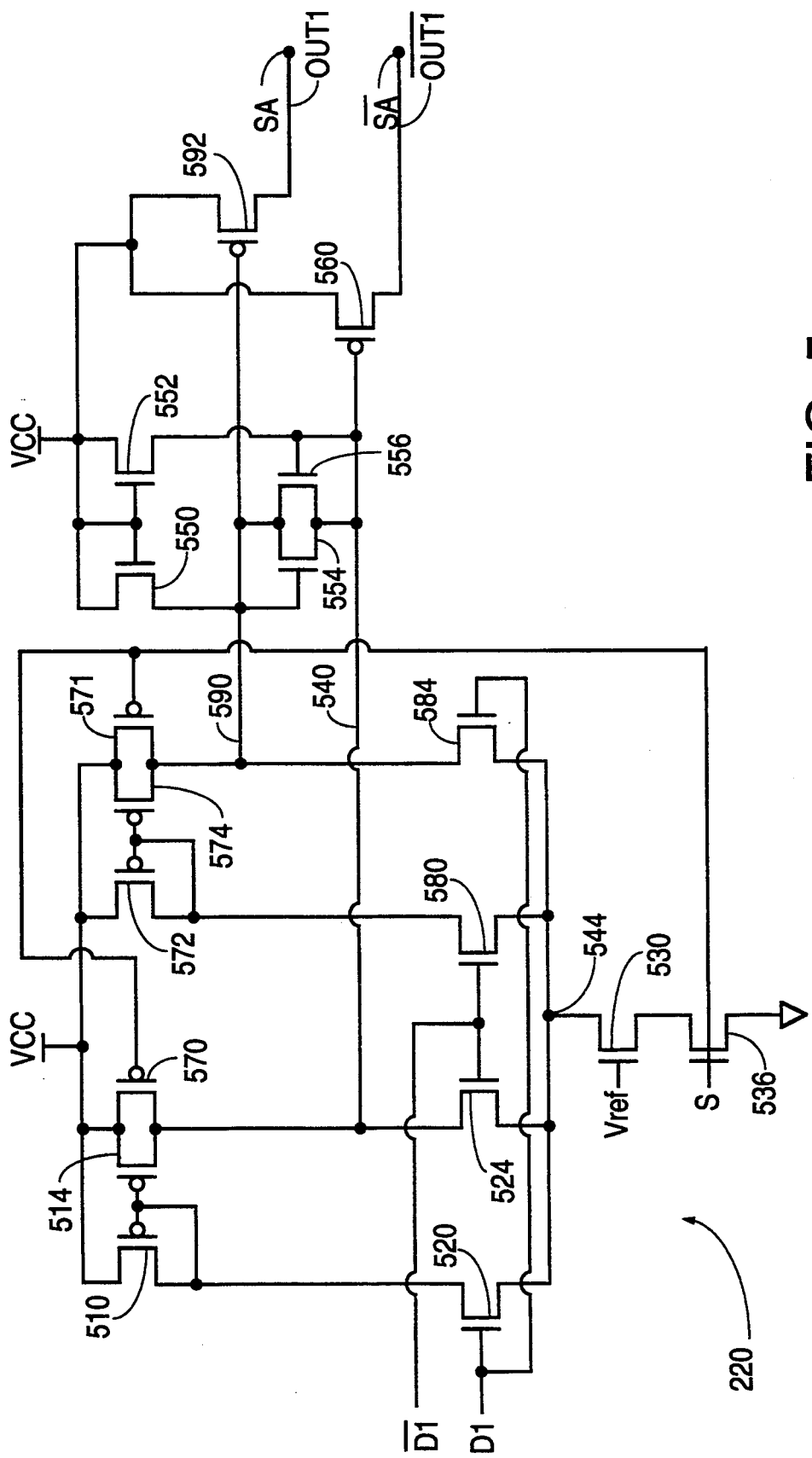
FIG. 5 is a circuit diagram of an amplifier which forms part of an amplifier of the present invention.

FIG. 5 is a circuit diagram of first sense amplifier 220 of which each sense amplifier 220.i is a copy. Matched PMOS transistors 510, 514, matched NMOS transistors 520, 524, and NMOS transistors 530, 536 form a current-mirror differential amplifier providing on node 540 a voltage indicative of the difference between the voltages on inputs D1, $\overline{D1}$. When the voltage on input D1 is higher than the voltage on input $\overline{D1}$, the voltage on node 540 is high, and when the voltage on input D1 is lower than the voltage on input $\overline{D1}$, the voltage on node 540 is low.

The current-mirror amplifier is formed as follows. Transistors 510, 514 form a current mirror. The sources of transistors 510, 514 are connected to the power supply VCC, and their gates are connected to each other. The gate and the drain of transistor 510 are connected to the drain of transistor 520. The gate of transistor 520 is connected to input D1. The drain of transistor 514 is connected to the drain of transistor 524 and to node 540. The gate of transistor 524 is connected to input $\overline{D1}$. The sources of transistors 520, 524 are connected to node 544 at the drain of transistor 530. The gate of transistor 530 is connected to a reference voltage Vref generated by a band gap voltage regulator described in the U.S. patent application Ser. No. 07/929,872 entitled "TTL Input Buffer with On-Chip Reference Bias Regulator and Decoupling Capacitor" filed by Ta-Ke Tien, Chau-Chin Wu and Richard Li on Aug. 11, 1992, which application is incorporated herein by reference. Vref is about 1.7 V when VCC=5.0 V. Vref is about 1.3 V when VCC=3.0 V.

The source of transistor 530 is connected to the drain of transistor 536 whose gate is connected to input S and whose source is connected to ground. The voltage on input S equals VCC when amplifier 220 is selected, and ground otherwise. When input S is at VCC, transistor 530 is in saturation. The current through transistors 530, 536 can be set to a desired value simply by setting the value of reference voltage Vref. Therefore, adjusting the first sense amplifier 220 to a different power supply voltage VCC is simplified. In particular, changing the sense amplifier 220 from VCC=5.0 V to VCC=3.0 V is simplified.

The common mode voltage on nodes D1, $\overline{D1}$ is about 2.95 V for VCC=5.0 V and about 2.0 V for VCC=3.0 V. When VCC=5.0 V, the voltage on each of the inputs D1, $\overline{D1}$ varies between 2.8 V and 3.1 V. Thus the difference between the voltages on inputs D1, $\overline{D1}$ is about 300 mV. The high value of the voltage on node 540 is slightly below VCC−|VTP| where VTP is the threshold voltage of the PMOS transistors 510, 514. The threshold voltage VTP of all the PMOS transistors of the first sense amplifier 220 and the second sense amplifier 240 is about −0.8 V at VCC=5.0 V, except where explicitly stated otherwise. The high voltage value on node 540 is about 4.0 V. The low voltage value when VCC=5.0 V is about 1.64 V below the high voltage value, that is, about 2.36 V. The low value is prevented from going below 2.36 V by the clamping circuit consisting of NMOS transistors 550, 552, 554, 556 as described below.

Node 540 is connected to the gate of PMOS transistor 560 whose source is connected to the power supply VCC and whose drain is connected to output $\overline{OUT1}$ and hence to high capacitance node $\overline{SA}$. Transistor 560 is in saturation providing fast current switching on node $\overline{SA}$ in response to the voltage changes on node 540. The voltage on node $\overline{SA}$ is kept substantially constant as described more fully below. The voltage on node $\overline{SA}$ varies only within a small range, between 3.587 V and 3.615 V (by 28 mV) if VCC=5.0 V. This 28 mV range of voltage changes on node SA is thus over than 10 times smaller than the 300 mV range of voltages on inputs DI, $\overline{D1}$.

Node 540 is a low capacitance node since node 540 is not connected to nodes of other first sense amplifiers 220.i. Hence, the voltage switching on node 540 is fast and power efficient.

PMOS transistor 570 is connected in parallel with transistor 514. The gate of transistor 570 is connected to input S. Transistor 570 is turned off when input S is high, that is, when first sense amplifier 220 is selected. When first sense amplifier 220 is deselected, transistor 570 turns on pulling node 540 to VCC and thus turning off transistor 560. Node $\overline{SA}$ is then driven by another first sense amplifier 220.i if one is selected.

Similarly, PMOS transistor 571 is connected in parallel with transistor 574. The gate of transistor 571 is connected to input S. Transistor 571 is off when input S is high. When input S is low, transistor 571 charges node 590 to VCC to turn off transistor 592.

Matched PMOS transistors 572, 574, matched NMOS transistors 580, 584, and transistors 530, 536 form another current-mirror differential amplifier providing, on node 590, a voltage indicative of the difference between the voltages on inputs D1, $\overline{D1}$. When the voltage on input $\overline{D1}$ is higher than the voltage on input D1, the voltage on node 590 is high, and when the voltage on input $\overline{D1}$ is lower than the voltage on input D1, the voltage on node 590 is low.

This current-mirror amplifier is formed as follows. Transistors 572, 574 form a current mirror. The sources of transistors 572, 574 are connected to the power supply VCC, and their gates are connected to each other. The gate and the drain of transistor 572 are connected to the drain of transistor 580. The gate of transistor 580 is connected to input $\overline{D1}$. The drain of transistor 574 is connected to the drain of transistor 584 and to node 590. The gate of transistor 584 is connected to input D1. The sources of transistors 580, 584 are connected to node 544 at the drain of transistor 530. Transistors 572, 574 have the same sizes as transistors 510, 514. Transistors 580, 584 have the same sizes as transistors 520, 524. The voltage on node 590 varies in the same range as the voltage on node 540.

Node 590 is connected to the gate of PMOS transistor 592 whose source is connected to the power supply VCC and whose drain is connected to output OUT1 and hence to the high capacitance node SA. Transistor 592 has the same size as transistor 560. The voltage on node SA is kept at substantially the same value as the voltage on node $\overline{SA}$. The difference between the voltages on nodes SA, $\overline{SA}$ is not more than about 20 mV when VCC=5.0 V. The voltage switching on node 590 is fast and power efficient because node 590 has a low capacitance. See the discussion above in connection with node 540.

The clamping circuit formed by transistors 550, 552, 554, 556 prevents the voltages on nodes 590, 540 from falling below a predetermined value, about 2.36 V if VCC=5.0 V. Consequently, the currents through transistors 592, 560 are kept at or below a predetermined value, about 0.65 mA when VCC=5.0 V. The voltages on nodes 590, 540 are prevented from falling below a value such as 2.36 V in order to increase the switching speed of the two nodes and of transistors 592, 560. Further, the currents on nodes SA, $\overline{SA}$ are kept from rising above 0.65 mA in order to increase the switching speed of various nodes of second sense amplifier 240.

The clamping circuit operation will be illustrated on the example of VCC=5.0 V. Transistors 550, 552, 554, 556 have a threshold voltage of about 1.4 V to 1.5 V. The remaining NMOS transistors of first sense amplifier 220 and of second sense amplifier 240 have a threshold voltage VTN of about 0.8 V. Transistors 550, 552, 554, 556, however, have a back bias (or body bias) of 2.0 V to 3.0 V, which raises their threshold voltage to the value of about 1.4 V to 1.5 V.

Transistor 550 is connected as a diode circuit with the gate and the drain connected together to form an anode terminal which is connected to the power supply voltage VCC. The cathode terminal—the source of transistor 550—is connected to node 590. Transistor 550 has a smaller size (i.e., smaller channel width/length dimension) and a longer channel than transistor 584 also connected to node 590. Thus while transistor 550 helps keep node 590 at about 2.36 V or above, transistor 550 does not prevent the larger transistor 584 from pulling node 590 to the low value of about 2.36 V.

Diode-connected transistor 552 has its gate and drain connected to power supply VCC and its source connected to node 540. Transistor 552 helps keep node 540 at about 2.36 V or above, Transistor 552 has the same size as transistor 550.

Diode-connected transistor 554 has its gate and drain connected to node 590 and its source connected to node 540. Diode-connected transistor 556 has its gate and drain connected to node 540 and its source connected to node 590. Transistors 554, 556 help keep the voltages on nodes 590, 540 not more than. 1.64 V apart. Thus the voltages on nodes 590, 540 range from about 2.36 V to 4.0 V. The currents through transistors 592, 560, which are determined by the voltages on nodes 590, 540, range from about 10.0 μA to about 0.65 mA.

The operation of the clamping circuit will also be illustrated on the following example. Suppose VCC=5.0 V, and the current through transistor 530 is kept constant at 2 mA. The combined current through transistors 520, 524 and the combined current through transistors 580, 584 are then 1 mA each. Suppose the voltage on input D1 is high—3.1 V and the voltage on input $\overline{D1}$ is low—2.8 V. The currents through transistors 524, 580 are low at, say, 0.2 mA each. The current through transistor 572 is then 0.2 mA, and this current is mirrored by transistor 574. The current through transistor 584 is 1 mA−0.2 mA=0.8 mA. Transistor 574 sources only 0.2 mA to node 590 and transistor 584 sinks 0.8 mA, and the difference 0.8 mA−0.2 mA=0.6 mA is supplied to transistor 584 by the clamping circuit. Without the clamping circuit, the current through transistor 584 would decrease, and the voltage VDS of transistor 584 would also decrease possibly forcing transistor 584 into the linear region and hence making amplifier 220 slower. The clamping circuit keeps transistor 584 in saturation and hence makes amplifier 220 faster.

The clamping circuit supplies 0.6 mA of current to node 590 through two branches: (1) transistors 556, node 540 and transistor 514, and (2) transistor 550. Since the two branches supply 0.6 mA the current through transistor 514 into node 590 is below 0.6 mA.

The current through transistor 510 which current is set by transistor 520 is 0.8 mA. The total current through transistor 514, however, is less than 0.8 mA. Indeed, the current through transistor 514 is the sum of the currents through transistor 524, which current is 0.2 mA, and the current through transistor 554 which is below 0.6 mA. Since matched transistors 510, 514 have the same VGS but transistor 514 has less current, transistor 514 is in the linear region. Therefore, the VDS of transistor 514, and hence the voltage on node 540, can be controlled by controlling the current through transistor 514. The sizes of transistors 514, 554 and 550 are chosen using methods known in the art so as to set the voltage on node 540 at about 4 V. Since transistor 554 is connected as a diode, the current through transistor 554, which is 0.2 mA less than the current through transistor 514, determines the voltage on node 590. The size of transistor 554—10 μm/0.8 μm—is chosen to keep the voltage on node 590 at about 2.36 V, i.e. slightly more than the threshold voltage of transistor 554 (1.4 V to 1.5 V) below the voltage on node 540.

Transistor 550 helps keep the voltage on node 590 from falling below 2.36 V. If the voltage on node 590 increases above 2.36, the current through transistor 554 decreases, and the voltage on node 540 goes up. Typically, the voltage on node 540 still stays below VCC−|VTP| so as to keep transistor 560 slightly on. At the same time, since the current through transistor 554 decreases, the voltage on node 590 decreases back to 2.36 V.

Transistor 552 is off because its VGS=1.0 V is less than its threshold voltage of 1.4 V to 1.5 V.

Figure 6:
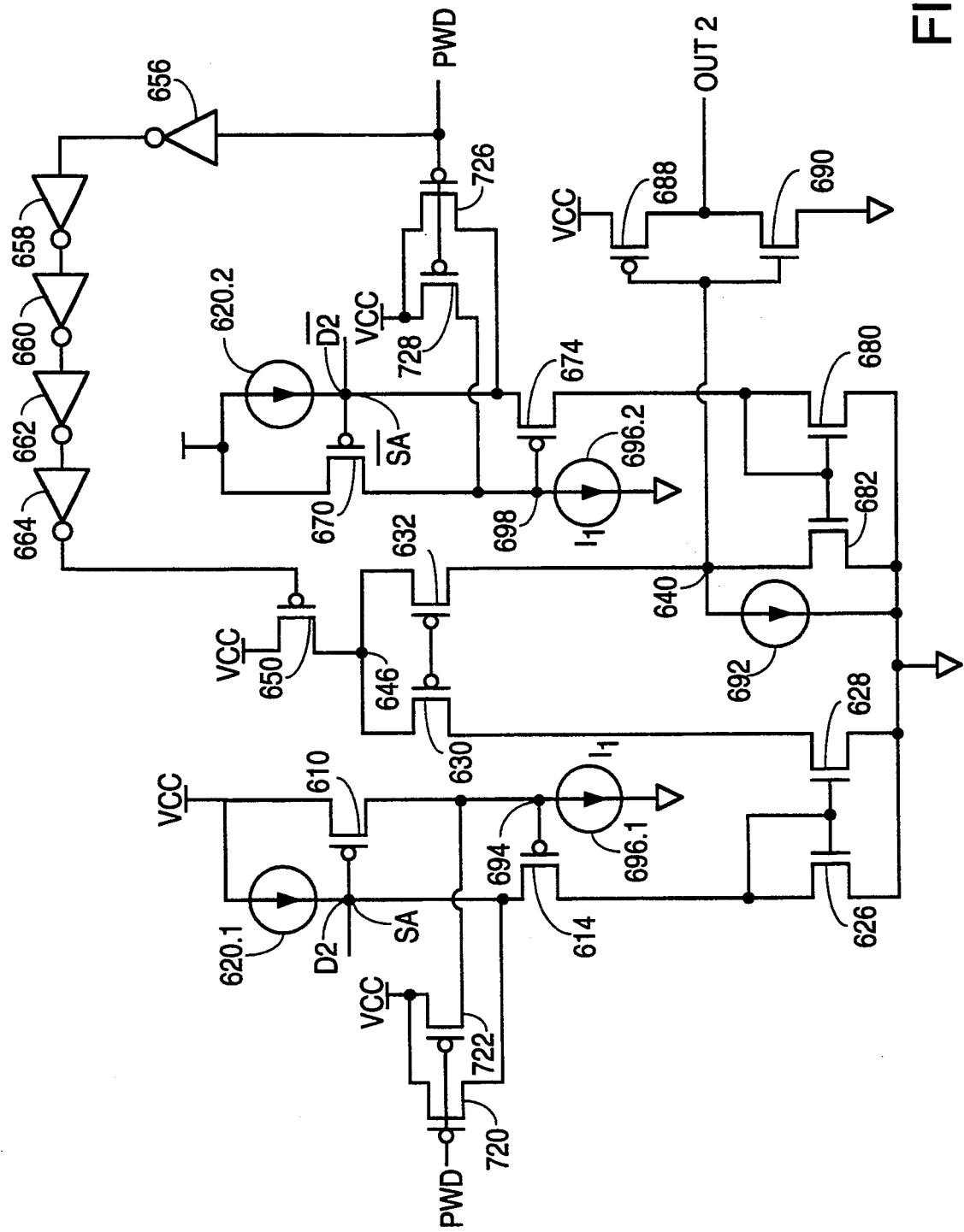
FIG. 6 is a circuit diagram of another amplifier which forms part of an amplifier of the present invention.

FIG. 6 is a circuit diagram of second sense amplifier 240. Node SA is connected to input D2 which in turn is connected to the gate of PMOS transistor 610 and to the source of PMOS transistor 614. Transistors 610 and 614 cooperate to keep the voltage at node SA substantially constant at about 1.6 V under VCC, as explained below.

Current source 620.1 sources about 50 μA current to node SA. Since first sense amplifier 220 sources about 10 μA to 0.065 mA of current to node SA (as described above) the total current flowing into node SA ranges from about 60 μA to about 0.7 mA. This current is sunk by transistors 614 and 626 which are connected in series between node SA and ground.

NMOS transistors 626, 628 form a current mirror. Their gates are connected to each other and to the drains of transistors 614 and 626, and their sources are connected to ground. Transistors 626 and 628 are in saturation. Transistor 628 is twice larger than transistor 626—the size (i.e., the channel width/length dimension) of transistor 626 is 10 μm/0.65 μm, and the size of transistor 628 is 20 μm/0.65 μm. Thus the current through transistor 628 is twice the current through transistor 626.

The current through transistor 628 is mirrored through PMOS transistors 630, 632 to node 640 connected to the drain of transistor 632. Namely, transistors 630, 632 form a current mirror with their gates connected to each other and to the drain of transistors 630 and 628 and with their sources connected to node 646. Node 646 is connected to power supply VCC through PMOS transistor 650. Transistor 650 is kept on by the high voltage on input PWD—the gate of transistor 650 is connected to input PWD through five serially connected inverters 656, 658, 660, 662, 664, and hence the gate is low when input PWD is high. Transistor 650 keeps node 646 at about VCC. The size of transistor 630—40 μm/0.7 μm—is chosen so as to keep transistor 628 in saturation when the current through transistor 628 is 1.4 mA or below (1.4 mA is twice the high value of the current at node SA). Transistor 632 is in saturation when the voltage on node 640 is sufficiently low, and transistor 632 has the same size as transistor 630. Hence when the voltage on node 640 is sufficiently low, the current through transistor 632 equals the current through transistor 630 which is twice the current into node SA. In particular, when the current into node SA is 60 μA, the current through transistor 632 is 120 μA. When the current into node SA is 0.7 mA, the current through transistor 632 is 1.4 mA.

Node $\overline{SA}$ is connected to input $\overline{D2}$ which in turn is connected to the gate of PMOS transistor 670 and to the source of PMOS transistor 674. Transistors 670 and 674 cooperate to keep the voltage at node $\overline{SA}$ substantially constant, as explained below.

Current source 620.2 sources about 50 μA current to node $\overline{SA}$. Thus the total current flowing into node $\overline{SA}$ ranges from about 60 μA to about 0.7 mA. This current is sunk by transistors 674 and 680 which are connected in series between node $\overline{SA}$ and ground.

NMOS transistors 680, 682 form a current mirror. Their gates are connected to each other and to the drains of transistors 674 and 680, and their sources are connected to ground. The drain of transistor 682 is connected to node 640. Transistor 682 is twice larger than transistor 680—transistor 682 has the same size as transistor 628, and transistor 680 has the same size as transistor 626. Thus when transistor 682 is in saturation, i.e. when the voltage on node 640 is sufficiently high, the current through transistor 682 is twice the current through transistor 680, that is, 120 μA or 1.4 mA depending on the current into node $\overline{SA}$.

If the current into node SA is greater than the current into node $\overline{SA}$, then the current through transistor 632 is greater than the current through transistor 682, and the voltage on node 640 is pulled to the high value of about VCC−200 mV, that is, to about 4.8 V at VCC=5.0 V. If the current into node SA is lower than the current into node $\overline{SA}$, the current through transistor 682 is higher than the current through transistor 632, and the voltage on node 640 is pulled to the low value of about 200 mV. Node 640 is a low capacitance node as it is not tied to other nodes of other sense amplifiers.

The voltage on node 640 is inverted by the CMOS inverter formed by PMOS transistor 688 and NMOS transistor 690 to provide a CMOS level signal on the inverter output connected to the output OUT2 of second sense amplifier 240.

Current source 692 sinks a current of up to about 50 μA from node 640 to ground in order to provide a known (low) state on node 640 in power-down mode. In power-down mode, current source 692 prevents the voltage on node 640 from oscillating and reaching intermediate values which would turn on both transistors 688 and 690 and increase the power consumption through the two transistors. Turning on both transistors 688 and 690 is also undesirable because it could cause the output OUT2 of sense amplifier 240 to oscillate and reach intermediate values so as to increase the power consumption in the external circuitry (not shown) connected to the output OUT2 and to cause oscillation in the external circuitry.

The voltage on high capacitance node SA is kept substantially constant by transistors 610, 614 as follows. The source of transistor 610 is connected to power supply VCC. The drain of transistor 610 is connected to node 694 which is connected to the gate of transistor 614. Current source 696.1 sinks a constant current I1 of about 0.5 mA from node 694 to ground. The voltage on node SA is such that the current through transistor 610 equals I1. Indeed, if the voltage on node SA becomes higher so that transistor 610 sinks less current than I1, the voltage on node 694 falls so as to make transistor 614 more conductive and bring the voltage on node SA down. If the voltage on node SA becomes so low that the current through transistor 610 exceeds I1, the voltage on node 694 rises, transistor 614 becomes less conductive, and the voltage on node SA goes up.

The voltages on nodes SA and 694 are such that transistor 614 sinks all the current flowing into node SA. Indeed, if the voltage on node 694 becomes so high relative to the voltage on node SA that transistor 614 sinks less current, the voltage on node SA rises. Hence, transistor 610 becomes less conductive, and the voltage on node 694 goes down. If the voltage on node 694 becomes so low relative to the voltage on node SA that transistor 614 sinks more current than flows into node SA, the voltage on node SA falls, transistor 610 becomes more conductive, and the voltage on node 694 goes up.

The voltage on node SA remains substantially constant because the current through transistor 610 is constant (equal to I1) and because transistor 610 is in saturation. Transistor 610 is in saturation for the following reason. As is well known, a MOS transistor is in saturation when $$|VDS| \geq |VGS - VTP| \tag{1}$$

where VDS is the drain-to-source voltage of the transistor (that is, the voltage at the source minus the voltage at the drain), VGS is the gate-to-source voltage, and VTP is the threshold voltage. See, for example, R. Gregorian et al *Analog MOS Integrated Circuits for Signal Processing* (1986) incorporated herein by reference, pages 72–74. Clearly, VDS=(VD−VG)+VGS, where VD is the drain voltage and VG is the gate voltage. For transistor 610, VD equals the voltage on the gate of transistor 614, and VG equals the voltage on the source of transistor 614. Since transistor 614 conducts, the voltage on its gate is lower than the voltage on its source. Hence, for transistor 610, VD−VG<0. Further since transistor 610 conducts, its VGS<0. Therefore, for transistor 610, $$|VDS| = |VD - VG| + |VGS| \qquad (2)$$

Further, because transistor 610 is a PMOS transistor, its VTP<0, and since transistor 610 conducts, its VGS<0 and |VGS|>|VTP|. Hence, the right hand side of inequality (1) equals |VGS|−|VTP|, and inequality (1) can be rewritten as:

$$|VD - VG| + |VGS| \geq |VGS| - |VTP|$$

or $$|VD - VG| \geq -|VTP| \qquad (3)$$

Inequality (3) holds true because its left hand side is non-negative and its right hand side is non-positive. Therefore, transistor 610 is in saturation.

Hence, the voltage on node SA connected to the gate of transistor 610 is substantially determined by the current I1 through transistor 610 and by the size of transistor 610. See R. Gregorian et al., supra. Since the current I1 remains constant, the voltage on the high capacitance node SA remains substantially constant. In fact, the voltage on node SA is slightly dependent on the voltage on node 694 which in turn depends on the current flowing into node SA as explained above. At VCC=5.0 V, the voltage on node SA increases by about 28 mV—from 3.587 V to 3.615 V—when the current on node SA increases from its low value of 120 μA to its high value of 0.7 mA. Thus, the voltage swing on node SA is not more than about 10% of the voltage swing on nodes D1, $\overline{D1}$ of sense amplifier 220 (FIG. 5). Because the voltage swing on node SA is small, the state switching of node SA is fast and power efficient.

A similar technique is used to keep the high capacitance node $\overline{SA}$ at a substantially constant voltage so as to provide fast and power efficient state switching on node $\overline{SA}$. More particularly, node $\overline{SA}$ is connected to the gate of transistor 670 whose source is connected to power supply VCC and whose drain is connected to node 698. Node 698 is connected to the gate of transistor 674. Current source 696.2 sinks the current I1 (about 0.5 mA) from node 698 to ground. The voltages on nodes SA and 698 are such that the current through transistor 670 equals I1 and the current through transistor 674 equals the total current flowing into node $\overline{SA}$. Transistor 670 is in saturation, and hence the voltage on node $\overline{SA}$ remains substantially constant. More precisely, the voltage on node $\overline{SA}$ increases by about 20 mV when the current flowing into node $\overline{SA}$ increases from its low value of about 120 μA to its high value of about 0.7 mA. Further, transistor 670 has the same size as transistor 610—50 μm/0.8 μm—and hence the voltage on node $\overline{SA}$ is about the same as the voltage on node SA. More precisely, the voltages on the two nodes differ by not more than about 20 mV when the current on one of the nodes is high and the current on the other node is low.

Transistors 614, 674 are kept in saturation by a proper choice of the current I1 and of the sizes of transistors 614, 610, 626, 674, 670, 680. Namely, the saturation inequality (1) above is made to hold true for transistor 614 as follows. The drain voltage VDS of transistor 614 equals the voltage VD of transistor 626 minus the voltage on node SA. The voltage on node SA is determined substantially by the current I1 and by the size of transistor 610 as described above. The drain voltage VD of transistor 626 is determined by the current through transistor 626 and the size of transistor 626 because the drain and the gate of transistor 626 are connected to each other and the source of transistor 626 is at a fixed voltage (ground). The size of transistor 626 is chosen so as to obtain a desired voltage VDS of transistor 614 when the current through transistor 626 has the high value of 0.7 mA. As explained below, if transistor 614 is in saturation at the current of 0.7 mA, transistor 614 will remain in saturation at lower current values.

Figure 7:
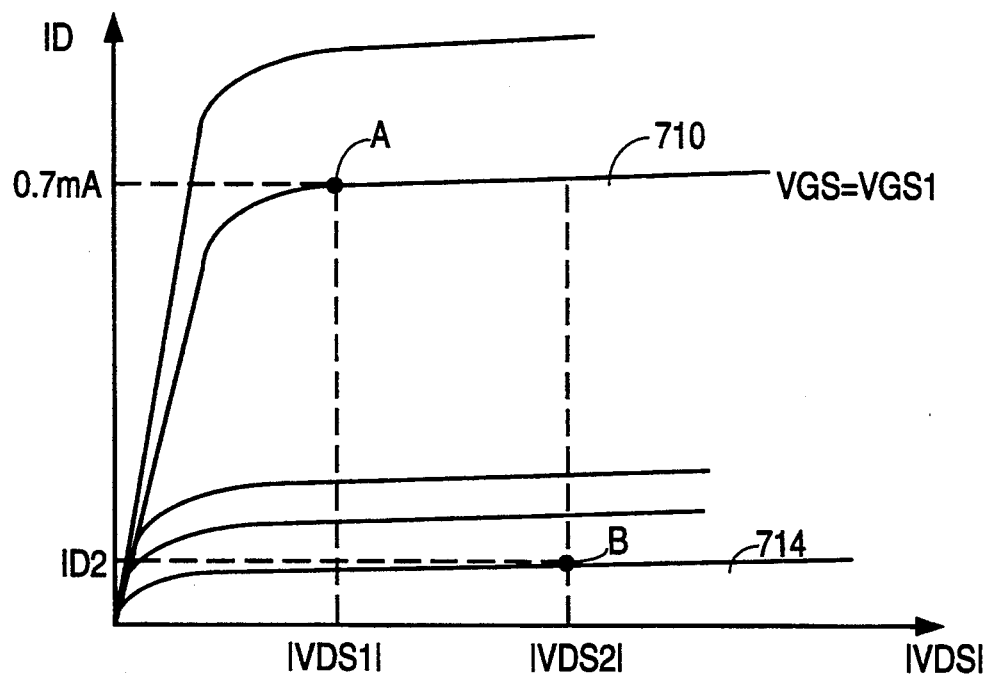
FIG. 7 illustrates the use of transistor curves for setting voltages in the amplifier of FIG. 6.

The voltage VDS of transistor 614 at the current of 0.7 mA is chosen as illustrated in FIG. 7. FIG. 7 shows the graph of the drain current ID of transistor 614 versus the absolute value |VDS| of transistor 614 at different values of VGS of transistor 614. Each drain current curve increases linearly in the linear region and then becomes substantially flat in the saturation region. See R. Gregorian, supra. The horizontal line ID=0.7 mA intersects some of the curves in the saturation region. One of these curves, curve 710 in FIG. 7, is chosen to define the VDS value of transistor 614. Namely, the VDS of transistor 614 is chosen to be the value VDS=VDS1 of the point A at the intersection of the horizontal line ID=0.7 mA with curve 710. The voltage VDS1 depends on the size of transistor 614 since the curves of FIG. 7 depend on the transistor size. In some embodiments, the size of transistor 614 is 50 μm/0.8 μm. The fabrication process is such that the current IDSSAT through the PMOS transistors at VDS=VGS=−5.0 V is 210 μA per 1 μm channel width at the channel length of 0.9 μm. (IDSSAT through NMOS transistors at VDS=VGS=5.0 V is 400 μA per 1 μm channel width at the channel length of 0.9 μm) The voltage VGS=VGS1 corresponding to curve 710 is −1.965 V. The voltage VGS1 and the voltage on node SA determine the voltage on node 694 which is 1.65 V. The voltage on node SA is 3,615 V, the voltage on the drain of transistor 614 is 1.71 V, and the voltage VDS1=−1.95 V when VCC=5.0 V.

Since transistor 614 is in saturation when the current flowing into node SA is 0.7 mA, transistor 614 is in saturation when the current into node SA is below 0.7 mA. Indeed, when the current decreases to some value ID2<0.7 mA, the voltage on the drain of transistor 626 decreases. Hence |VDS| of transistor 614 increases to some value shown as |VDS2| in FIG. 7. Since the current decreases and the absolute value |VDS| increases, the point B of the intersection of the lines VDS=VDS2 and ID=ID2 is lower and further to the right in FIG. 7 than point A. Since point A is in the saturation region of a drain current curve, point B is also in the saturation region of some lower curve 714. Hence, transistor 614 remains in saturation When VCC=5.0 V and the current is at its low value of 60

μA, the voltage VDS of transistor 614 is −2,632 V; the voltage on the drain of transistor 614 is 0.955 V, the voltage on node SA is 3.587 V, VGS of transistor 614 is −1.227 V and the voltage of node 694 is, accordingly, 2.36 V.

Voltage VDS of transistor 614 at the current of 0.7 mA, and the size of transistor 614, can be set also analytically as follows. When transistor 614 is in the linear region, its current ID satisfies the equation $$ID = k[|VGS-VTP|*|VDS|-(\tfrac{1}{2})*VDS^2] \quad (4)$$

where the transconductance parameter k is given by $$k = \mu * C_{ox} * (w/1), \quad (5)$$

μ is the surface current carrier mobility (hole mobility) in the transistor channel, $C_{ox}$ is the gate oxide capacitance, w is the channel width, and 1 is the channel length. See R. Gregorian, supra. Further, in the linear region $$|VDS| < |VGS-VTP| \quad (6)$$

Solving the equation (4) for $|VGS-VTP|$ and substituting into inequality (6), we obtain that in the linear region $$VDS^2 < (2/k)*ID \quad (7)$$

Hence, if $$VDS^2 \geq (2/k)*ID \quad (8)$$

transistor 614 is in saturation.

The condition (S) is made to hold true for transistor P6 by setting k and VDS to desired values. Namely, the transconductance parameter k is set to a desired value by selecting appropriately the channel width and length of transistor 614. The voltage VDS is set to a desired value by setting the current I1 and the sizes of transistor 610 and 626. If the inequality (8) is true for the high current value of 0.7 mA, the inequality remains true for lower current values because when the current ID decreases, the right hand side of the inequality (8) decreases and the left hand side, as discussed above, increases. Thus transistor 614 remains in saturation.

Because transistors 610 and 614 are in saturation, high switching speed is provided. Namely, because transistor 610 is in saturation, transistor 610 reacts fast even to minute changes in the voltage on node SA, thereby providing fast voltage switching on the low capacitance node 694. Because transistor 614 is in saturation, transistor 614 reacts fast to the voltage changes on node 694 so as to sink exactly the amount of current that flows into node SA and hence to keep node SA at a substantially constant voltage. Transistors 610 and 614 are fairly large for fast voltage switching on node 694 and for keeping the voltage on node SA substantially constant. The size of each of transistors 610 and 614 is 50 μm/0.8 μm.

Transistors 670, 674, 680 have the same sizes as, respectively, transistors 610, 614, 626. Transistors 670, 674 are hence in saturation, providing fast switching similarly to transistors 610, 614.

When the memory is not being read, the signal on node 426 (FIG. 4) is driven low (to ground) to reconfigure first sense amplifiers 220.i and second sense amplifier 240 for low power consumption. Input S of each sense amplifier 220.i is driven low by NAND gate 432.i and inverter 438.i to disable current through transistors 530, 536 (FIG. 5) of first sense amplifiers 220.i. Transistors 570, 571 turn on charging the respective nodes 540, 590 to VCC. Hence, transistors 560, 592 turn off disabling the current into nodes $\overline{SA}$, SA.

Input PWD of second sense amplifier 240 is driven low. Low input PWD turns off current sources 620.1, 620.2, 696.1, 696.2. PMOS transistor 720 (FIG. 6) whose source is connected to power supply VCC, whose drain is connected to node SA and whose gate in connected to input PWD, turns on and charges node SA to VCC. PMOS transistor 722 whose source is connected to power supply VCC, whose drain is connected to node 694 and whose gate is connected to input PWD, turns on and charges node 694 to VCC. Transistor 614 therefore turns off, disabling the current through transistor 626.

Similarly, PMOS transistor 726 whose source is connected to power supply VCC, whose drain is connected to node $\overline{SA}$ and whose gate is connected to input PWD, charges node $\overline{SA}$ to VCC; PMOS transistor 728, whose source is connected to power supply VCC, whose drain is connected to node 698 and whose gate is connected to input PWD, charges node 698 to VCC; and transistor 674 turns off disabling the current through transistor 680. Transistor 650 turns off disabling the current into node 646. Current source 692 remains on pulling node 640 to ground and thus preventing the voltage on node 640 from oscillating and from reaching an invalid state. The low voltage on node 640 forces the output OUT2 to VCC which is a valid CMOS state.

Figure 8:
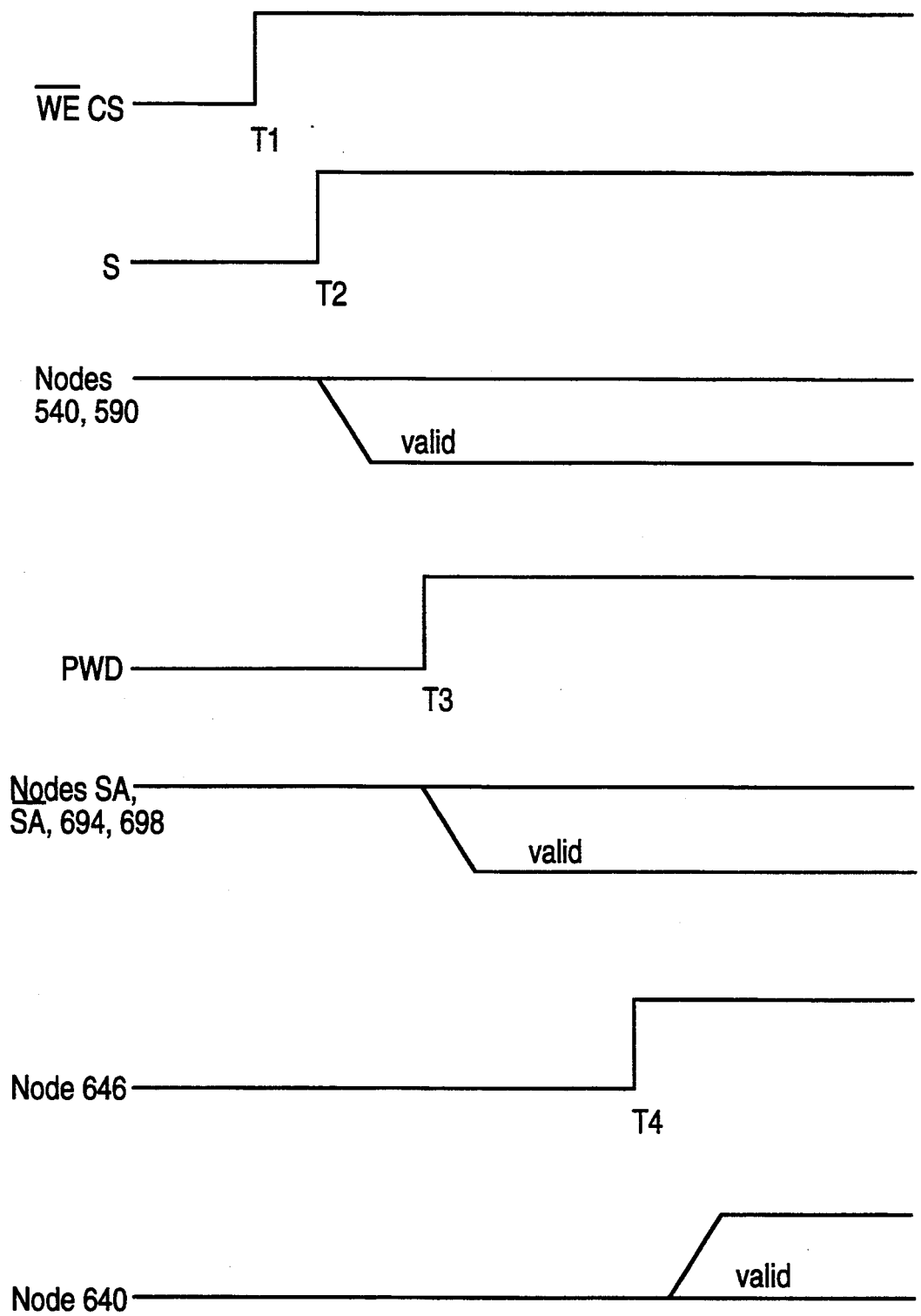
FIG. 8 is a timing diagram of certain signals in the amplifier of FIGS. 5 and 6.

FIG. 8 illustrates a return from the power-down mode. The return is initiated at a time shown as T1 when the signal $\overline{WE}$ AND CS becomes high. Node 426 is then driven high. Input S of the first sense amplifier 220.i selected by the Y-pass gate 230 (FIG. 4) becomes high at a later time T2 after a delay through the gate 432.i and inverter 438.i. Transistor 536 (FIG. 5) of the selected sense amplifier 220.i turns on, and transistors 570 and 571 turn off. Nodes 540, 590 are pulled down by transistors 524, 584 to the voltages indicative of the voltages on inputs D1, $\overline{D1}$. Transistors 592, 560 turn on and develop proper currents on nodes SA, $\overline{SA}$.

Then, at a time T3, input PWD of sense amplifier 240 becomes high. The delay until time T3 is due to inverters 482, 486 (FIG. 4). Current sources 620.1, 620.2, 696.1, 696.2 turn on. Transistors 610, 614, 670, 674 turn on to set the proper voltage on the high capacitance nodes SA, $\overline{SA}$. Because nodes SA $\overline{SA}$ were precharged to VCC the voltage on the two nodes is pulled down quickly by transistors 614, 674 to the proper value of about 1.6 V below VCC. If nodes SA, $\overline{SA}$ had not been precharged to VCC and the voltage on at least one node, say, node SA, drifted below its proper value, node SA would have to be charged up by the current flowing into the node. If the current had the low value of 60 μA, charging the high capacitance node SA could take a long time. Hence, precharging node SA to VCC in power-down mode speeds up return from the power-down.

While nodes SA, $\overline{SA}$ settle to their proper voltage, transistor 650 remains off due to the delay of inverters 656, 658, 660, 662, 664. Hence, node 640 is kept low. In particular, the voltage on node 640 is prevented from oscillating during settling of the heavy capacitance nodes SA, $\overline{SA}$ and of nodes 694, 698 and transistors 610, 614, 626, 670, 674, 680.

Then, at a time T4, transistor 650 turns on enabling node 640 to sense the currents on nodes SA, $\overline{SA}$ and to transfer the sensed values to output OUT2, The sizes of some of the transistors of sense amplifier 240 are as follows, The size of transistor 650 is 100 μm/0.7 μm. The size of each of transistors 720, 722, 728, 726 is 5 μm/0.8 μm. The size of each of transistors 630, 632 is 40 μm/0.7 μm.

Figure 9:
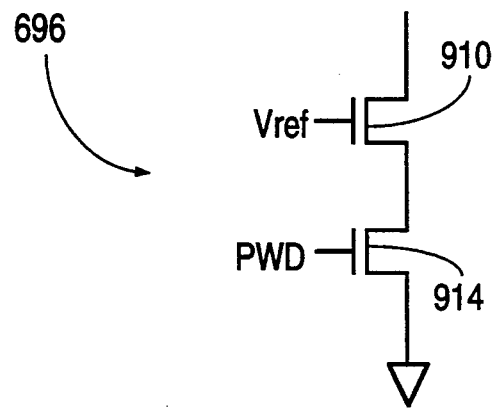
FIGS. 9–11 are circuit diagrams of portions of the amplifier of FIG. 6.

FIG. 9 shows one embodiment of current source 696 of which the current sources 696.1, 696.2 are copies. Current source 696 includes NMOS transistor 910 whose gate is connected to reference voltage Vref. The drain of transistor 910 is connected to node 694 in current source 696.1 and to node 698 in current source 696.2. The source of transistor 910 is connected to the drain of NMOS transistor 914 whose source is connected to ground and whose gate is connected to input PWD. When input PWD is high, transistor 910 is in saturation providing constant current I1.

Figure 10:
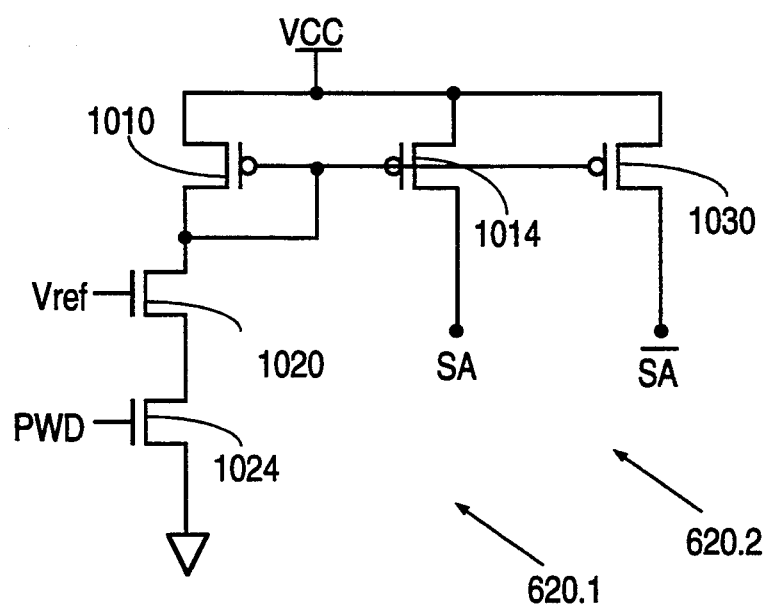

FIG. 10 is a circuit diagram of one embodiment of current sources 620.1, 620.2. Current source 620.1 is formed by PMOS transistors 1010, 1014 and NMOS transistors 1020, 1024. Transistors 1010, 1014 form a current mirror. The gates of transistors 1010, 1014 are connected to each other and to the drain of transistor 1010. The sources of transistors 1010, 1014 are connected to power supply VCC. The drain of transistor 1020 is connected to the drain of transistor 1010, the gate of transistor 1020 is connected to reference voltage Vref, and the source of transistor 1020 is connected to the drain of transistor 1024. The gate of transistor 1024 is connected to input PWD, and the source is connected to ground. Transistors 1010 and 1014 have the same size. When input PWD is high, transistors 1010, 1014 and 1020 are in saturation, transistors 1010 and 1014 have equal currents, and the current through transistor 1014 flows into node SA.

Current source 620.2 is formed by PMOS transistors 1010, 1030 and NMOS transistors 1020, 1024 in the same manner. Transistor 1030 has the same size, and hence the same current, as transistor 1010, and the current through transistor 1030 flows into node $\overline{SA}$.

In some embodiments, the gate of transistor 1024 is connected to power supply voltage VCC rather than to input PWD.

Figure 11:
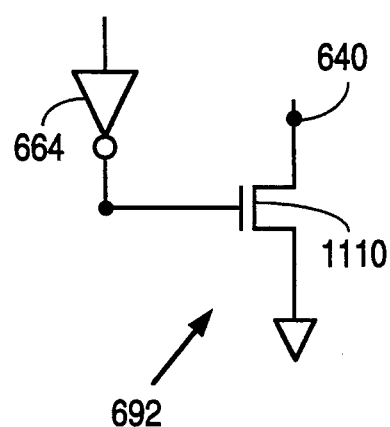

FIG. 11 illustrates one embodiment of current source 692. Current source 692 is formed by an NMOS transistor 1110 connected between node 640 and ground. The gate of transistor 1110 is connected to the output of inverter 664.

In one embodiment, the transistor sizes of second sense amplifier 240 are as follows. The size of each of transistors 610, 670 is 60 μm/0.9 μm. The size of each of transistors 614, 674 is 50 μm/0.9 μm. The size of each of transistors 626, 680 is 20 μm/0.8 μm. The size of each of transistors 628, 682 is 40 μm/0.8 μm.

The size of each of transistors 630, 632 is 60 μm/0.9 μm. The size of transistor 650 is 100 μm/0.9 μm. The size of each of transistors 720 726 is 20 μm/0.9 μm. The size of each of transistors 722, 728 is 6 μm/0.9 μm.

In each of current sources 696.1, 696.2, the size of transistor 914 is 25 μm/0.8 μm.

Current sources 620.1, 620.2 (FIG. 6) are formed as shown in FIG. 10, except that the gate of transistor 1024 is connected to power supply VCC rather than to input PWD. The size of each of transistors 1010, 1014, 1030, 1020 is 5 μm/1.3 μm, and the size of transistor 1024 is 5 μm/0.8 μm.

The size of transistor 1110 (FIG. 11) is 10 μm/0.8 μm.

The size of transistor 688 is 30 μm/0.8 μm and the size of transistor 690 is 10 μm/0.8 μm.

Figure 12:
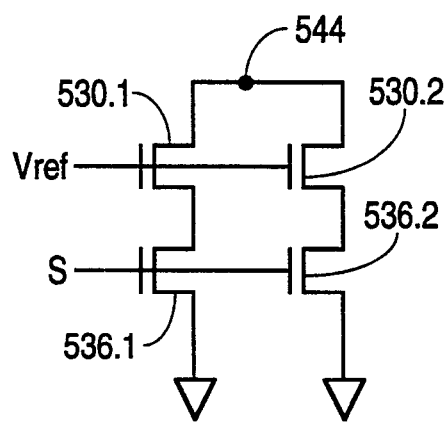
FIG. 12 is a circuit diagram of a portion of an amplifier of the present invention.

FIG. 12 illustrates a variation of first sense amplifier 220. Sense amplifier 220 of FIG. 12 is similar to the sense amplifier 220 of FIG. 5 except that the transistors 530, 536 of FIG. 5 are replaced by the circuit of FIG. 12. In that circuit, node 544 is connected to the drains of NMOS transistors 530.1, 530.2. The gates of transistors 530.1, 530.2 are connected to reference voltage Vref. The source of transistor 530.1 is connected to the drain of NMOS transistor 536.1 whose gate is connected to input S and whose source is connected to ground. The source of transistor 530.2 is connected to the drain of NMOS transistor 536.2 whose gate is connected to input S and whose source is connected to ground. The size of transistor 530.1 is 50 μm/1.3 μm; the size of transistor 530.2 is 25 μm/1.3 μm; the size of transistor 536.1 is 50 μm/0.8 μm; and the size of transistor 536.2 is 25 μm/0.8 μm. When signal S is high, transistors 530.1, 530.2 are in saturation.

The sizes of the remaining transistors of sense amplifier 220 in the variation of FIG. 12 are as follows. The size of each of transistors 510, 514, 572, 574, which transistors are illustrated in FIG. 5 is 12 μm/1.3 μm. The size of each of transistors 520, 524, 580, 584 is 20 μm/0.9 μm. The size of each of transistors 570, 571 is 6 μm/0.9 μm. The size of each of transistors 550, 552 is 3 μm/1.3 μm. The size of each of transistors 554, 556 is 10 μm/0.8 μm. The size of each of transistors 592, 560 is 20 μm/0.9 μm.

Sense amplifiers 220, 240 can be easily adjusted from VCC=5.0 V to VCC=3.0 V. For both VCC=5.0 V and VCC=3.0 V, the voltage on each node 590, 540 of first sense amplifier 220 should be such that even when the voltage is high, the respective transistor 592 or 560 is on so as to provide fast switching as explained above, and even when the voltage is low, the respective transistor 584, 524 and transistors 530, 530.1, 530.2 are in saturation to provide fast voltage switching on nodes 590, 540. Transistors 520, 580 should also be in saturation for fast voltage switching on nodes 590, 540. When VCC decreases from 5.0 V to 3.0 V, the VDS values of the NMOS transistors 520, 524, 580, 584, 530, 530.1, 530.2 decrease. Further, the |VGS| values of some transistors including transistors 520, 524, 580, 584 decrease, and hence the currents through the transistors decrease making the amplifier slower.

Figure 13:
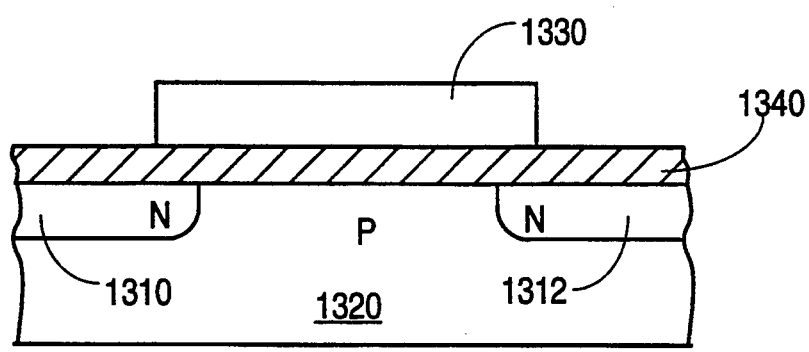
FIG. 13 shows a cross section of an NMOS transistor to illustrate one technique for adjusting the amplifier of the present invention to different power supply voltages.

The currents can be increased by reducing the absolute values of the transistor threshold voltages. The threshold voltages can be reduced in absolute value by reducing the gate oxide thickness as illustrated in FIG. 13. FIG. 13 illustrates a cross section of an NMOS transistor. N-doped source region 1310 and N-doped drain region 1312 are formed in P-doped semiconductor substrate 1320. The conductive gate 1330 is separated from source region 1310, drain region 1312 and the channel region between source region 1310 and drain region 1312 by a gate oxide insulation layer 1340. If the thickness of layer 1340 is reduced, the threshold voltage is reduced. In some embodiments, the thickness of layer 1340 is about 165Å for VCC=5.0 V and about 110Å for VCC=3.0 V. The NMOS transistor threshold voltage VTN=0.8 V for VCC=5.0 V, and VTN=0.5 V for VCC=3.0 V. The PMOS transistor threshold voltage VTP is −0.8 V for VCC=5.0 V and −0.7 V for VCC=3.0 V.

In some embodiments, the VDS values of transistors 520, 524, 580, 584, 530, 530.1, 530.2 are increased by increasing the low value of the voltages on nodes 590, 540. The low value is increased by making transistors 550, 552, 554, 556 larger.

Further, to allow more room for voltage changes on nodes 590, 540, the voltage Vref is reduced to about 1.3 V so that transistors 530, 530.1, 530.2 remain in saturation at lower VDS values. The voltage on node 544 can then be reduced, and the voltages on nodes 590, 540 can reach lower values, without forcing transistors 524, 584 into the linear region.

In some embodiments, the size of transistors 520, 524, 580, 584 is increased so as to reduce their VGS for the same current value through the transistors. Since VGS is reduced, these transistors remain in saturation at lower VDS values.

While the invention was illustrated with respect to the embodiments described above, other embodiments and variations are within the scope of the invention. In particular, the invention is not limited to CMOS embodiments, but NMOS, PMOS, TTL, BiCMOS and other technologies can be used to practice the invention. Further, the invention is not limited by voltage and current values and transistor sizes. The amplifiers of the invention are suitable for SRAM, DRAM and other memories and for non-memory circuits. The invention is not limited by the number of columns in each column group of the memory array (FIG. 2). The invention is suitable for memories in which each column has only one bit line BL.i rather than two complementary bit lines BL.i and $\overline{BL}.i$. In such embodiments, one data input of each first amplifier 220.k is connected to respective bit line BL.i through a pass transistor, while the other data input is connected to a reference voltage, for example, to the voltage 3.5 V at VCC=5.0 V. Other embodiments and variations are within the scope of the invention which is defined by the following claims.

What is claimed is:

1. A current sensing amplifier comprising:
   an input node N1;
   a field effect transistor FET1 having terminals S1 and D1 and having a gate G1 coupled to said node N1;
   a field effect transistor FET2 having terminals S2 and D2 and having a gate G2, said terminal S2 being coupled to said node N1, said gate G2 being coupled to said terminal D1;
   a current source CS1 coupled to said terminal D1;
   a node O for providing a voltage indicative of a current on said node N1; and
   a current mirror circuit CM1 coupled to said terminal D2 and said node O for providing at said node O a current indicative of a current at said terminal D2,
   wherein during amplification said transistors FET1, FET2 cooperate so that a voltage change on node N1 changes a current through transistor FET1 so as to change a voltage on said gate G2 so as to change a current through transistor FET2 so as to counteract said voltage change on said node N1, thereby keeping a voltage on said node N1 substantially constant and substantially independent of a current on said node N1.

2. The amplifier of claim 1 wherein said transistors FET1, FET2 have the same conductivity type.

3. The amplifier of claim 2 wherein said transistors FET1 and FET2 are PMOS transistors.

4. The amplifier of claim 1 further comprising means for connecting said terminal S1 to a source of power.

5. The amplifier of claim 1 wherein said current mirror circuit CM1 comprises:
   a field effect transistor FET3 having a terminal D3 and a gate G3 coupled to each other and to said terminal D2 and further having a terminal S3; and
   a field effect transistor FET4 having a terminal S4 coupled to said terminal S3, a gate G4 coupled to said gate G3, and a terminal D4 coupled to said node O.

6. The amplifier of claim 1 wherein said current mirror circuit CM1 comprises:
   a field effect transistor FET3 having a terminal D3 and a gate G3 coupled to each other and to said terminal D2 and further having a terminal S3;
   a field effect transistor FET4 having a terminal S4 coupled to said terminal S3, a gate G4 coupled to said gate G3, and further having a terminal D4;
   a field effect transistor FET5 having a terminal D5 and a gate G5 coupled to each other and to said terminal D4 and further having a terminal S5; and
   a field effect transistor FET6 having a terminal S6 coupled to said terminal S5, a gate G6 coupled to said gate G5, and a terminal D6 coupled to said node O.

7. The amplifier of claim 1 further comprising:
   an input node N2;
   a field effect transistor FET3 having terminals S3 and D3 and having a gate G3 coupled to said node N2;
   a field effect transistor FET4 having terminals S4 and D4 and having a gate G4, said terminal S4 being coupled to said node N2, said gate G4 being coupled to said terminal D3;
   a current source CS2 coupled to said terminal D3; and
   a current mirror circuit CM2 coupled to said terminal D4 and said node O for providing at said node O a current indicative of a current at said terminal D2, wherein during amplification said current mirror circuit CM1 sources current into said node O and said current mirror circuit CM2 sinks current from said node O so that the voltage on said node O is indicative of a difference between currents at said terminals D2 and D4.

8. The amplifier of claim 7 wherein during amplification said transistors FET3, FET4 cooperate so that a voltage change on node N2 changes a current through transistor FET3 so as to change a voltage on said gate G4 so as to change a current through transistor FET4 so as to counteract said voltage change on said node N2, thereby keeping a voltage on said node N2 substantially constant and substantially independent of a current on said node N2.

9. The amplifier of claim 7 further comprising:
   a current source connected to said node N1 for maintaining a non-zero current at said node N1; and
   a current source connected to said node N2 for maintaining a non-zero current at said node N2.

10. The amplifier of claim 7 further comprising a current source connected to said node O for providing a predetermined valid-state voltage at said node O when said amplifier is in a power-down mode.

11. The amplifier of claim 10 wherein said current mirror circuit CM1 comprises:
    a field effect transistor FET5 having a terminal D5 and a gate G5 coupled to each other and to said terminal D2 and further having a terminal S5;

a field effect transistor FET6 having a terminal S6 coupled to said terminal S5, a gate G6 coupled to said gate G5, and further having a terminal D6;

a field effect transistor FET7 having a terminal D7 and a gate G7 coupled to each other and to said terminal D6 and further having a terminal S7; and a field effect transistor FET8 having a terminal S8 coupled to said terminal S7, a gate G8 coupled to said gate G7, and a terminal D8 coupled to said node O; and said current mirror circuit CM2 comprises:

a field effect transistor FET9 having a terminal D9 and a gate G9 coupled to each other and to said terminal D4 and further having a terminal S9; and a field effect transistor FET10 having a terminal S10 coupled to said terminal S9, a gate G10 coupled to said gate G9, and a terminal D10 coupled to said node O; and said amplifier further comprises means for coupling said terminals S7 and S8 to a source of power, said means decoupling said terminals S7 and S8 from said source of power in response to a power-down signal.

12. An amplifier comprising the amplifier of claim 11 and further comprising:
an input node IN1;
an input node IN2; and
an amplifier A1 for amplifying a difference between voltages on said nodes IN1, IN2 and providing currents on said nodes N1, N2.

13. The amplifier of claim 12 wherein said current sensing amplifier further comprises:
a terminal for receiving said power-down signal; and
means connected between said terminal for receiving said power-down signal and said means for coupling said terminals S7 and S8 to said source of power, for delaying coupling said terminals S7, S8 to said source of power on deassertion of said power-down signal so that when said power-down signal is deasserted on return from a power-down mode, valid-state voltages are developed by said amplifier A1 on said nodes N1, N2 before said terminals S7, S8 are coupled to said source of power.

14. An amplifier comprising the amplifier of claim 7 and further comprising:
an input node IN1;
an input node IN2; and
an amplifier A1 for amplifying a difference of voltages on said nodes IN1, IN2 and providing currents on said nodes N1, N2.

15. A memory comprising the amplifier of claim 14 and further comprising:
a plurality of memory cells;
a plurality of bit lines for sensing states of said memory cells; and
a decoder for selectively connecting one of said bit lines to said node IN1 and another one of said bit lines to said node IN2.

16. The amplifier of claim 14 wherein said amplifier A1 comprises:
a field effect transistor FET11 having a gate G11 coupled to said node IN1 and having terminals S11, D11;
a field effect transistor FET12 having a gate G12 coupled to said node IN2, a terminal S12 coupled to said terminals S11, and having a terminal D12;
a current mirror circuit CM3 comprising:
a field effect transistor FET13 having a terminal D13 and a gate G13 coupled to each other and to said terminal D11 and further having a terminal S13; and
a field effect transistor FET14 having a terminal S14 coupled to said terminal S13, a gate G14 coupled to said gate G13, and a terminal D14 coupled to said terminal D12;
a field effect transistor FET15 having a gate G15 coupled to said node IN2, a terminal S15 coupled to said terminal S12, and having a terminal D15;
a field effect transistor FET16 having a gate G16 coupled to said terminal IN1, a terminal S16 coupled to said terminal S15, and having a terminal D16;
a current mirror circuit CM4 comprising:
a field effect transistor FET17 having a terminal D17 and a gate G17 coupled to each other and to said terminal D15 and further having a terminal S17; and
a field effect transistor FET18 having a terminal S18 coupled to said terminal S17, a gate G18 coupled to said gate G17, and a terminal D18 coupled to said terminal D16;
a current source coupled to said terminals S11, S12, S15, S16;
means for converting a voltage on said terminal D18 into a current on said node N1;
means for converting a voltage on said terminal D14 into a current on said node N2;
means M1 for coupling said terminal D14 to said terminal D18; and
means M2 for coupling said terminal D18 to a source of power so that when a voltage on said terminal D14 exceeds a voltage on said terminal D18 by at least a predetermined value, said means M1, M2 and said transistors FET14, FET16 cooperate to force said transistor FET14 into a linear region of operation thereby allowing a current through transistor FET14 to determine a voltage on said terminal D14.

17. An amplifier comprising:
an input node IN1;
an input node IN2;
a field effect transistor FET11 having a gate G11 coupled to said node IN1 and having terminals S11, D11;
a field effect transistor FET132 having a gate G12 coupled to said node IN2, a terminal S12 coupled to said terminal S11, and having a terminal D12;
a current circuit mirror CM3 comprising:
a field effect transistor FET13 having a terminal D13 and a gate G13 coupled to each other and to said terminal D11 and further having a terminal S13; and
a field effect transistor FET14 having a terminal S14 coupled to said terminal S13, a gate G14 coupled to said gate G13, and a terminal D14 coupled to said terminal D12;
a field effect transistor FET15 having a gate G15 coupled to said node IN2, a terminal S15 coupled to said terminal S12, and having a terminal D15;
a field effect transistor FET16 having a gate G16 coupled to said terminal IN1, a terminal S16 coupled to said terminal S15, and having a terminal D16;
a current mirror circuit CM4 comprising:

a field effect transistor FET17 having a terminal D17 and a gate G17 coupled to each other and to said terminal D15 and further having a terminal S17; and a field effect transistor FET18 having a terminal S18 coupled to said terminal S17, a gate G18 coupled to said gate G17, and a terminal D18 coupled to said terminal D16;

a current source coupled to said terminals S11, S12, S15, S16;

means M1 for coupling said terminal D14 to said terminal D18; and means M2 for coupling said terminal D18 to a source of power so that when a voltage on said terminal D14 exceeds a voltage on said terminal D18 by at least a predetermined value, said means M1, M2 and said transistors FET14, FET16 cooperate to force said transistor FET14 into a linear region of operation thereby allowing a current through transistor FET14 to determine a voltage on said terminal D14.

18. The amplifier of claim 17 wherein:
said means M1 comprises a diode circuit coupled between said terminals D14 and D18; and
said means M2 comprises a diode circuit for coupling said terminal D18 to said source of power.

19. A method for converting a current into a voltage, said method comprising the steps of:
providing a first current to a terminal S2 of a field effect transistor FET2 which also has a terminal D2 and a gate G2;
controlling a voltage on said gate G2 so that a current through said transistor FET2 counteracts voltage changes on said terminal S2, thereby keeping a voltage on said terminal S2 substantially constant; and
mirroring a current on said terminal D2 to a node O so that a voltage on said node O is indicative of the current on said terminal D2.

20. The method of claim 19 further comprising the steps of:
providing a second current to a terminal S4 of a field effect transistor FET4 which also has a terminal D4 and a gate G4;
controlling a voltage on said gate G4 so that a current through said transistor FET4 counteracts voltage changes on said terminal S4, thereby keeping a voltage on said terminal S4 substantially constant; and
mirroring a current on said terminal D4 to said node O so that said voltage on said node O is indicative of a difference between said currents on said nodes D2, D4.

21. A method for converting a difference between two voltages into a current, said method comprising the steps of:
providing a first voltage to gates of field effect transistors FET11, FET16, and providing a second voltage to gates of field effect transistors FET12, FET15, wherein said transistor FET11 has terminals S11, D11, said transistor FET12 has terminals S12, D12, said transistor FET15 has terminals S15, D15, said transistor FET16 has terminals S16, D16, and wherein said terminals S11, S12, S15, S16 are connected to a current source;
providing a current to said terminal D11 by a field effect transistor FET13 which has a terminal D13 coupled to said terminal D11 and to a gate of said transistor FET13;
providing a current to said terminal D12 by a field effect transistor FET14 which has terminal D14 coupled to said terminal D12 and which has a gate coupled to the gate of said transistor FET13;
providing a current to said terminal D15 by a field effect transistor FET17 which has a terminal D17 coupled to said terminal D15 and to a gate of said transistor FET17;
providing a current to said terminal D16 by a field effect transistor FET18 which has a terminal D18 coupled to said terminal D16 and which has a gate coupled to the gate of said transistor FET17;
converting a voltage on said terminal D14 into a current; and
when a voltage on said terminal D14 exceeds a voltage on said terminal D18 by at least a predetermined value, coupling said terminal D18 to said terminal D14 and to a source of power so as to force said transistor FET14 into a linear region of operation thereby allowing a current through transistor FET14 to determine a voltage on said terminal D14.

* * * * *